(12) United States Patent
Wang et al.

(10) Patent No.: US 11,984,370 B2
(45) Date of Patent: May 14, 2024

(54) SEMICONDUCTOR TESTING STRUCTURE AND METHOD FOR FORMING SAME

(71) Applicant: CHANGXIN MEMORY TECHNOLOGIES, INC., Hefei (CN)

(72) Inventors: Xiangyu Wang, Hefei (CN); Haibo Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 451 days.

(21) Appl. No.: 17/453,852

(22) Filed: Nov. 7, 2021

(65) Prior Publication Data

US 2023/0008265 A1    Jan. 12, 2023

Related U.S. Application Data

(63) Continuation of application No. PCT/CN2021/111848, filed on Aug. 10, 2021.

(30) Foreign Application Priority Data

Jul. 9, 2021 (CN) .......................... 202110777975.5

(51) Int. Cl.
*H01L 21/66* (2006.01)
(52) U.S. Cl.
CPC .................................... *H01L 22/32* (2013.01)
(58) Field of Classification Search
CPC ...... H01L 22/32; H01L 22/34; G01R 31/2884
USPC ........................ 257/48; 324/762.01, 537, 500
See application file for complete search history.

(56) References Cited

U.S. PATENT DOCUMENTS

| 5,037,771 A | 8/1991 | Lipp |
| 7,629,689 B2 | 12/2009 | Maeda |
| 9,230,871 B1 | 1/2016 | Wang |
| 9,541,601 B2 | 1/2017 | Pagani |

(Continued)

FOREIGN PATENT DOCUMENTS

| CN | 102445644 B | 2/2014 |
| CN | 105304614 A | 2/2016 |

(Continued)

OTHER PUBLICATIONS

Supplementary European Search Report in the European application No. 21881358.2, mailed on Jun. 21, 2023. 9 pages.

(Continued)

*Primary Examiner* — Giovanni Astacio-Oquendo
(74) *Attorney, Agent, or Firm* — Syncoda LLC; Feng Ma

(57) ABSTRACT

A semiconductor testing structure forming method includes: a semiconductor substrate is provided, and the semiconductor substrate includes a plurality of active areas arranged separately; a first conductive wire is formed at a preset distance from the plurality of active areas in the semiconductor substrate, and the first conductive wire is connected with a substrate of a respective active device formed in each of the plurality of active areas; a plurality of first contact holes is formed on the first conductive wire; and a first metal layer is formed on top of each of the plurality of first contact holes to obtain the semiconductor testing structure, where the first metal layer is electrically connected with a first common pad and the first common pad is configured to perform an electric performance test on the semiconductor testing structure.

20 Claims, 12 Drawing Sheets

(56) References Cited

U.S. PATENT DOCUMENTS

| | | | |
|---|---|---|---|
| 10,180,456 | B2 | 1/2019 | Pagani |
| 10,746,787 | B2 | 8/2020 | Pagani |
| 2005/0161835 | A1 | 7/2005 | Maeda |
| 2007/0212824 | A1 | 9/2007 | Chen |
| 2008/0224134 | A1 | 9/2008 | Bae |
| 2012/0193787 | A1 | 8/2012 | Maitani |
| 2013/0026466 | A1 | 1/2013 | Pagani |
| 2015/0162251 | A1 | 6/2015 | Jeong et al. |
| 2017/0082684 | A1 | 3/2017 | Pagani |
| 2017/0227597 | A1* | 8/2017 | Zettler .................. G01R 31/26 |
| 2019/0107575 | A1 | 4/2019 | Pagani |
| 2021/0102990 | A1* | 4/2021 | Lu ...................... G01R 27/2605 |
| 2022/0326301 | A1* | 10/2022 | Chang .................. H01L 23/528 |

FOREIGN PATENT DOCUMENTS

| | | |
|---|---|---|
| CN | 206282851 U | 6/2017 |
| CN | 109560001 A | 4/2019 |
| CN | 111679170 A | 9/2020 |
| IN | 106298565 A | 1/2017 |

OTHER PUBLICATIONS

First Office Action of the Taiwanese application No. 111123881, issued on Mar. 13, 2023.

International Search Report in the international application No. PCT/CN2021/111848, mailed on Mar. 29, 2022.

\* cited by examiner

SEMICONDUCTOR TESTING STRUCTURE AND METHOD FOR FORMING SAME

CROSS-REFERENCE TO RELATED APPLICATIONS

This is a continuation of International Patent Application No. PCT/CN2021/111848 filed on Aug. 10, 2021, which claims priority to Chinese Patent Application No. 202110777975.5 filed on Jul. 9, 2021. The disclosures of the above-referenced applications are hereby incorporated by reference in their entirety.

BACKGROUND

To put more devices with different dimensions and different properties in a limited Test Element Group (TEG) space, it is necessary to provide shared pads to save quantity of used pads and improve the space utilization. For example, sources, gates and substrates of a plurality of active devices-Metal Oxide Semiconductors (MOSs) transistors on a same Scrap Line (SL) are led out via a first metal layer and are respectively connected to shared pads at different positions from above or below the SL, and drains of the plurality of MOS transistors are respectively connected with respective pads corresponding to the drains, to save the quantity of the used pads.

SUMMARY

Embodiments of the disclosure relate to but are not limited to, a semiconductor testing structure and a method for forming the same.

In a first aspect, embodiments of the disclosure provide a method for forming a semiconductor testing structure. The method includes the following operations. A semiconductor substrate is provided, in which the semiconductor substrate at least includes a plurality of active areas arranged separately. A first conductive wire is formed at a preset distance from the plurality of active areas in the semiconductor substrate, and the first conductive wire is connected with the substrate of a respective active device formed in each of the plurality of active areas. A plurality of first contact holes is formed on the first conductive wire. A first metal layer is formed on top of each of the plurality of first contact holes to obtain the semiconductor testing structure. The first metal layer is electrically connected with a first common pad, and the first common pad is configured to perform an electric performance test on the semiconductor testing structure.

In a second aspect, embodiments of the disclosure provide a semiconductor testing structure. The semiconductor testing structure includes a semiconductor substrate, a first conductive wire, a plurality of first contact holes formed on the first conductive wire, and a first metal layer. The semiconductor substrate at least includes a plurality of active areas arranged separately. The first conductive wire is connected with a substrate of a respective active device formed in each of the plurality of active areas, and the first conductive wire is formed in the semiconductor substrate and is at a preset distance from the plurality of active areas. The first metal layer is located on top of each of the plurality of first contact holes. The first metal layer is electrically connected with a first common pad, and the first common pad is configured to perform an electric performance test on the semiconductor testing structure.

BRIEF DESCRIPTION OF THE DRAWINGS

In the drawings (which are not necessarily drawn to scale), similar reference numerals may describe similar components in different views. The similar reference numerals with different alphabetic suffixes may represent different examples of similar parts. The drawings substantially illustrate various embodiments discussed herein by way of examples rather than limitations.

Figure 1:
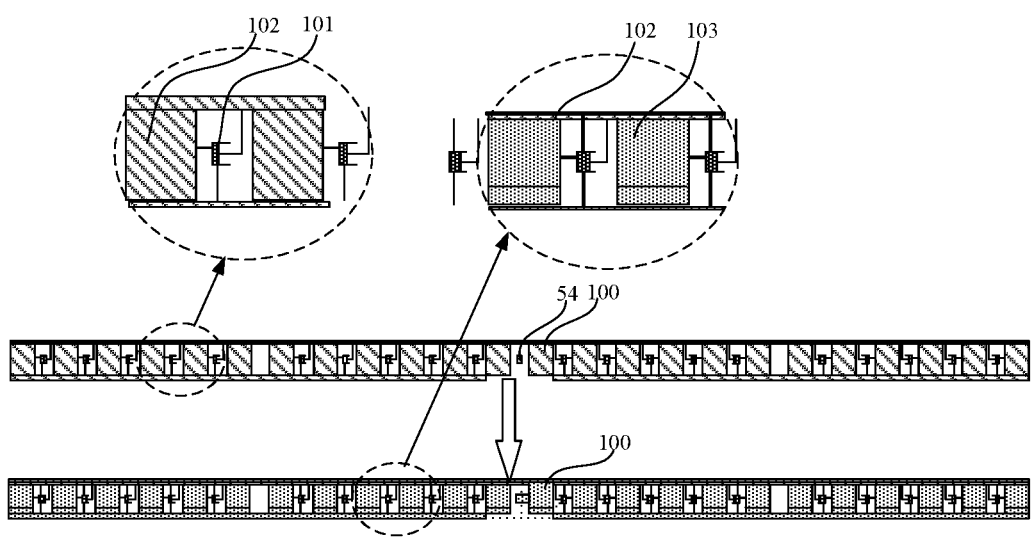
FIG. 1 is a schematic structure diagram of a whole TEG in some implementations.

Reference numerals are illustrated as follows.
50/501—Active Area (AA); 51—Poly-silicon (Poly-Si) Contact hole (PC); 102/52—first metal layer Metal 0 (M0); 53—Poly-silicon Gate (PG); 103/54—second metal layer Metal 1 (M1); 54/303—well.
101/500—semiconductor substrate; 502—reserved position; 501—first metal layer; 503—connection pad; 301/5031—second common pad; 100/504—first common pad; 505—first conductive wire; 5051—first leading-out terminal; 5052—second leading-out terminal; 506—active device; 5061—third leading-out terminal; 506'—source; 506"—gate; 506'"—drain; 5071—first contact hole; 5072—second contact hole; 508—second conductive wire; 509—third conductive wire; 201/510—metal wire; 511—fourth conductive wire.

DETAILED DESCRIPTION

In order to make purposes, technical solutions and advantages of embodiments of the disclosure clearer, specific technical solution of the disclosure will be described in further detail below in combination with drawings in the embodiments of the disclosure. The embodiments below are used for describing the disclosure and are not used for limiting the scope of the disclosure.

In the following description, suffixes such as "module" and "unit" used for describing elements are only for facilitating description of the disclosure, and have no specific meaning. Therefore, terms such as "module" or "unit" may be used interchangeably.

The disclosure relates to testkey design field and more specifically relates to device layout design. Specifically, various embodiments of the disclosure can be used in a phenomenon that more devices may not be placed in the limited TEG space due to the fact that the quantity of the required devices is gradually increased (the scrap line space is limited) and a feature size of an integrated circuit device is gradually scaled down.

Due to limitation in a Design Rule (DR), a width of the SL is increasingly narrow, and spaces for wiring the first metal layer above and below the SL is limited. In such case, only one first metal layer above or below the SL is allowed to be laid, which leads to a condition that a substrate of a MOS transistor may not be connected to the first common pad via the first metal layer. One solution is to connect a well with substrates of the plurality of MOS transistors eclectically, to lead out substrate current via the well. However, in this case, since the well is directly connected with a substrate of a wafer, when testing the first metal layer, the wafer is placed on a chuck of a measurement device, in such way, some of the current in the MOS transistor may leak from the chuck via the substrate and the well. As a result, electrical drift of the MOS transistor may occur, and further, electric adjustment of the MOS transistor may be affected.

According to various embodiments of the disclosure, the space of the TEG can be utilized effectively, in addition, leakage of current can be inhibited while increasing the quantity of the devices with four or multiple ports being placed, then, reliability of device analysis for testing the first metal layer M0 can be enhanced.

At present, with development of chip technologies, in order to obtain the integrated circuit with high performance and small area, types of the devices required in circuit design are increased. The space of the SL in a wafer is fixed, thus it is necessary to provide shared pads when more devices with different dimensions and different properties need to be placed in, to save the quantity of pads and improve the utilization of the SL space. As the semiconductor device may be the MOS transistor, in the disclosure, the semiconductor substrate is identical to the MOS transistor substrate.

FIG. 1 is a schematic structure diagram of a whole TEG in some implementations. As illustrated in FIG. 1, PAD13 100 is taken as a common pad (a first common pad) of a BUCK (a substrate of a MOS transistor) 101. PAD13 100 is connected via a second metal layer Metal 1 (M1) 103. There is no metal wire to connect the MOS transistor with the PAD 13 100 where the BUCK 101 is located in the connection of M0 102, and the MOS transistor is merely electrically connected with the BUCK 101 via a well 54.

The space of the SL in the wafer is fixed. In order to place more devices with different dimensions and different properties in the fixed space of the SL, it is necessary to utilize the shared pads to improve the space utilization. However, in application processes, not only the design criterion but also conditions that may occur in the preparation process (for example, shorting of metals) need to be considered.

Figure 2A:
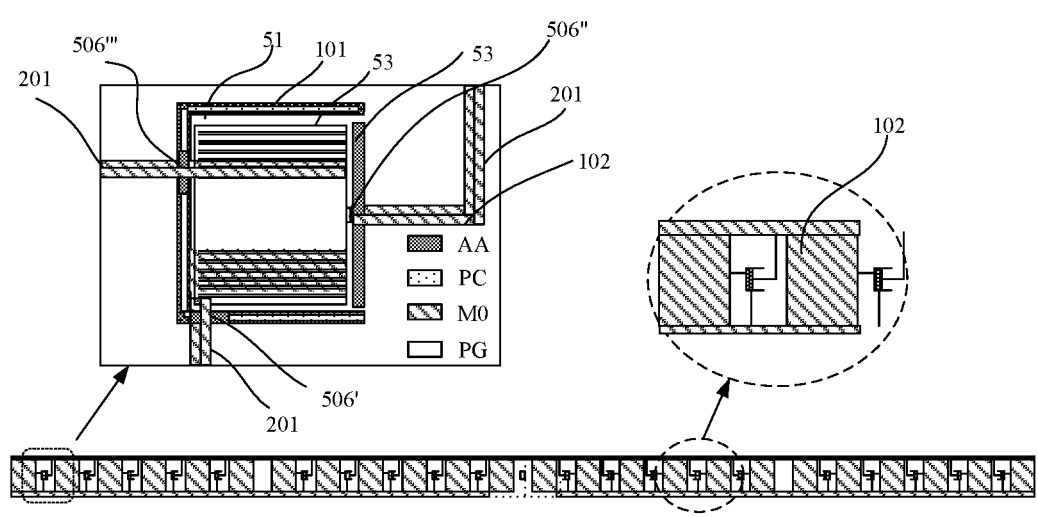
FIG. 2A is a schematic structure diagram of a TEG of an MOS transistor in some implementations.

A TEG structure of one MOS transistor may be seen in FIG. 2A. Each input/out terminal of a device (MOS transistor) is connected with a PAD via a metal wire 201, to facilitate electrical test and analysis of the first metal layer/final pass (M0/FP)

Figure 2B:
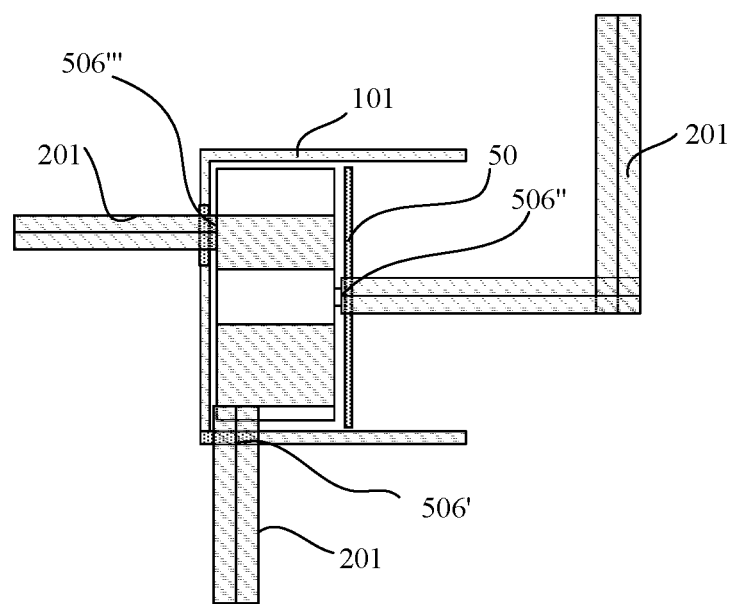
FIG. 2B is a schematic diagram of a single metal wire connected with a first metal layer of a pad in some implementations.

FIG. 2B is a schematic diagram of a single metal wire connected with a first metal layer of a pad in some implementations. As illustrated in FIG. 2B, the metal wire 201 is a single metal wire, and no metal wire 201 is led out from the substrate 101 of the MOS transistor, to be connected with the pad corresponding to the substrate.

Figure 3:
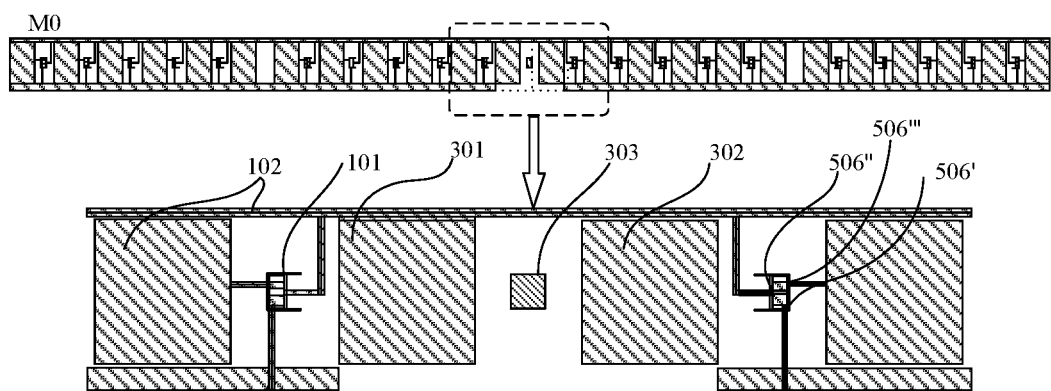
FIG. 3 is a schematic diagram of a connection manner of MOS transistors in a conventional TEG in some implementations.

FIG. 3 is a schematic diagram of a connection manner of MOS transistors in a conventional TEG in some implementations. As illustrated in FIG. 3, PAD12 301 is taken as a shared pad (the second common pad) of gates 506" of the MOS transistors, and sources 506' of the MOS transistors share a common PAD4, that is, the gates 506" of the MOS transistors share a different PAD from the sources 506" of the MOS transistors. In M0 102, metals wires need to be led out from above or below the different MOS transistors to be connected to the PADs corresponding to the MOS transistors respectively, as a result, the shared BUCK 101 may not able to be connected directly with the PAD 13 302 via the M0 102. Although the BUCK 101 may be led out through a well 303, when the M0 102 is actually tested, since the well 303 is connected with the substrate of the water directly, it is necessary to place the wafer on the chuck of the measurement device during test, in such way, some of the current in the MOS transistor may leak from the substrate and the chuck. As a result, electrical drift may occur, and further, electric adjustment of the device may be affected.

Figure 4:
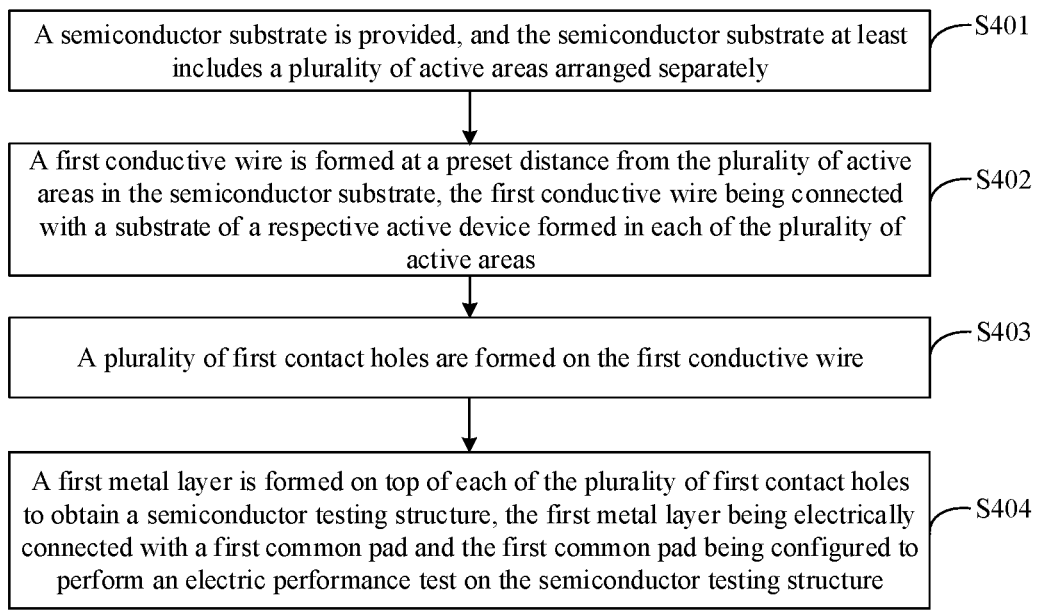
FIG. 4 is a flowchart of a method for forming a semiconductor testing structure provided in an embodiment of the disclosure.

In consideration of the above-mentioned technical problem, the embodiments of the disclosure provide a method for forming a semiconductor testing structure. As illustrated in FIG. 4, the method includes the following operations.

S401, a semiconductor substrate is provided, the semiconductor substrate at least includes a plurality of active areas arranged separately.

Herein, a material of the semiconductor substrate may be selected from one of Si, SiGe, SiC, $Al_2O_3$, AlN, ZnO, $Ga_2O_3$, $LiAlO_2$, etc. As the Si substrate is low-priced and easy to dope, and is easy to react to generate a heterogeneous isolation layer, in the embodiments of the disclosure, Si is selected as the substrate.

It is to be understood that an active area refers to an area for forming the active device on the semiconductor substrate. A plurality of active devices arranged separately may be correspondingly formed in the plurality of active areas arranged separately. For example, the active device may be a triode, a thyristor, an MOS transistor and a semiconductor resistor and capacitor.

In the embodiments of the disclosure, the semiconductor substrate at least includes one active area.

S402, a first conductive wire is formed at a preset distance from the plurality of active areas in the semiconductor substrate, the first conductive wire is connected with a substrate of a respective active device formed in each of the plurality of active areas.

Herein, the preset distance may be a distance that is greater than 0 and is determined according to a width of the semiconductor testing structure and a width of the active area. The width of the semiconductor testing structure refers to a width of a bottom surface of the substrate from a view of the bottom surface of the substrate of the semiconductor testing structure. The width of the active area refers to a size of the active area in a direction that is the same with a width direction of the semiconductor testing structure. For example, the width of the semiconductor testing structure may be a and the width of the active area may be b (smaller than a), and the preset distance s is smaller than $(a-b)/2$ under the condition that the active area is located in a middle position of the semiconductor testing structure. Of course, for the preset distance s, it is also necessary to consider a width c of the first conductive wire and a required distance d between the first conductive wire and an edge of the substrate closest to the first conductive wire. In an example, s=(a−b)/2−c−d.

It is to be understood that the semiconductor substrate may include a top surface on a front side, and it may be considered that the first conductive wire and the active areas are all located on the top surface of the semiconductor substrate when ignoring the flatness of the top surface. In a possible implementation, the first conductive wire is parallel to a wire connecting the positions where the plurality of active areas are located, and the first conductive wire may be located above each of the active areas or below each of the active areas, which is not specifically limited herein.

In a possible implementation mode, the operation that the first conductive wire is formed at the preset distance from the plurality of active areas in the semiconductor substrate may be implemented by depositing a conductive material on the semiconductor substrate to form the first conductive wire at the preset distance from the plurality of active areas.

Herein, the conductive material may be one of metal materials or semiconductor materials, for example, the metal material may include Cu, Ag and Au, and the semiconductor material may include Si, Ge and gallium arsenide (GaAs). The conductive material may be a mixed material of multiple metal materials, a mixed material of multiple semiconductor materials or a mixed material of a metal material and a semiconductor material. For example, the mixed material of multiple metal materials may be a mixed material of Cu and Ag; the mixed material of multiple semiconductor materials may be a mixed material of Si and Ge; and the mixed material of the metal material and the semiconductor material may be a mixed material of Cu and Si. In the embodiments of the disclosure, the conductive material may be Poly-Si in the semiconductor materials.

In the embodiments of the disclosure, an advantage of the first conductive wire formed at the preset distance from the active areas by depositing Poly-Si is that since deposition of Poly-Si is a step for forming a gate structure, an additional mask is not required, such that the complexity of the process can be reduced.

In an implementation, the operation that the first conductive wire is connected with the substrate of the active device formed in each of the active areas may be implemented by the following operation. A second leading-out terminal of the first conductive wire is connected with the substrate of the active device formed in each of the active areas via a metal wire and a contact hole.

S403, a plurality of first contact holes are formed on the first conductive wire.

Herein, the first contact hole refers to a connection channel between the first conductive wire and a first metal layer.

In a possible implementation, the operation that the plurality of first contact holes are formed on the first conductive wire may include the following operations. Firstly, a plurality of through holes are formed on the first conductive wire, and then the plurality of through holes are filled with a conductive material to form the plurality of first contact holes on the first conductive wire.

S404, a first metal layer is formed on top of each of the plurality of first contact holes to obtain the semiconductor testing structure. The first metal layer is electrically connected with a first common pad and the first common pad is configured to perform an electric performance test on the semiconductor testing structure.

It is to be understood that the first metal layer belongs to the first layer in a metal interconnection layer. The first common pad may be a common pad used to connect all substrates of the active devices formed in the active areas in the semiconductor testing structure. In some embodiments, there may be a dielectric layer between the first metal layer and the first conductive wire, it is to be understood that the first metal layer is insulated from the first conductive wire.

In an example, the operation that the first metal layer is formed on top of each of the plurality of first contact holes to obtain the semiconductor testing structure may include the following operation. The first metal layer located on top of each of the plurality of first contact holes is formed by depositing the metal material, to obtain the semiconductor structure.

For example, an implementation of the operation that the first metal layer is electrically connected with the first common pad may be as follows. The first metal layer connected with the first common pad is formed by depositing the metal material on the first common pad.

Since the formed first conductive wire is connected with the substrate of the active device formed in each of the active areas, and the plurality of first contact holes on the first conductive wire are connected with the first meta layer, in addition, the first metal layer is electrically connected with the first common pad, thus the first conductive wire is connected with the first common pad. In such way, the substrate of the active device formed in each of the active areas may be connected with the first common pad via the first conductive wire. Therefore, when the first metal layer is tested, even if the wafer is placed on the chuck of the measurement device, a voltage injected by a test probe into the first common pad will be introduced to the substrate of the active device formed in each of the active areas via the first conductive wire but will not leak, such that electrical drift and effect on electrical adjustment of the MOS transistor can be reduced.

FIG. 5A to FIG. 5F are diagrams of a process of forming a semiconductor testing structure provided in an embodiment of the disclosure. Reference is made to the schematic structure diagram in a process of forming a semiconductor testing structure in FIG. 5A to FIG. 5F, a method for forming a semiconductor device provided in the embodiments of the disclosure would be further described in detail.

Figure 5A:
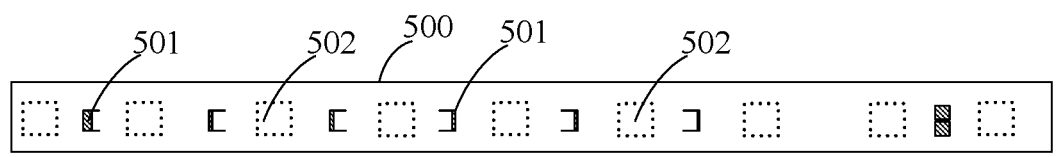
FIG. 5A is a first diagram illustrating a process of forming a semiconductor testing structure provided in an embodiment of the disclosure.

First, reference is made to FIG. 5A, the operation at S401 is executed: a semiconductor substrate is provided. The semiconductor substrate at least includes a plurality of active areas arranged separately.

FIG. 5A is a schematic diagram of a layout including active areas arranged separately provided in the embodiments of the disclosure. As illustrated in FIG. 5A, a semiconductor substrate 500 includes seven active areas 501 arranged separately, herein, a reserved position 502 is arranged between adjacent active areas 501.

Figure 5B:
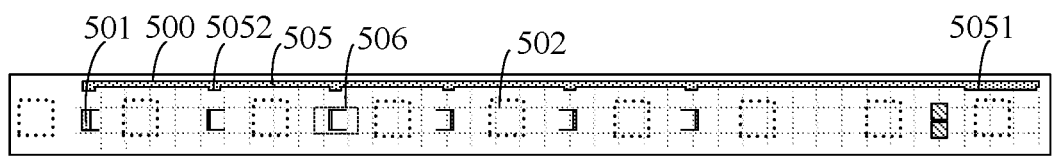
FIG. 5B is a second diagram illustrating a process of forming a semiconductor testing structure provided in an embodiment of the disclosure.
Figure 5C:
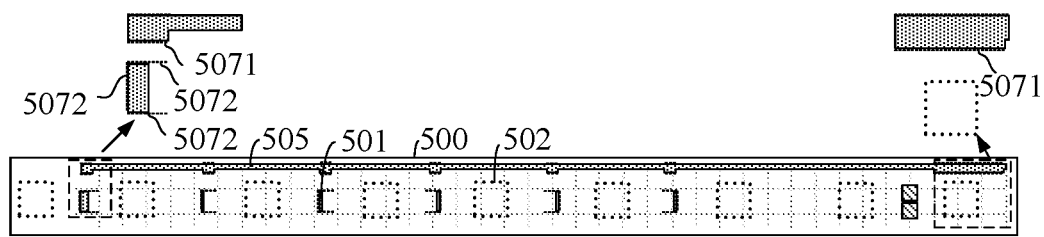
FIG. 5C is a third diagram illustrating a process of forming a semiconductor testing structure provided in an embodiment of the disclosure.
Figure 5D:
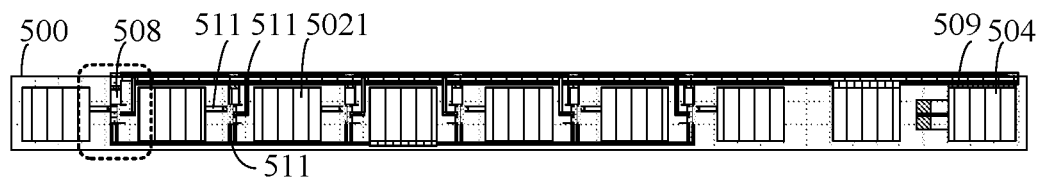
FIG. 5D is a fourth diagram illustrating a process of forming a semiconductor testing structure provided in an embodiment of the disclosure.

It is to be understood that a metal connection layer above the semiconductor substrate 500, i.e., the first metal layer 5021 in FIG. 5D, would be formed in a subsequent step. Connection pads 503 and a first common pad 504 would be formed in positions of the first metal layer 5021 corresponding to the reserved positions 502, and the connection pads 503 and the first common pad 504 are all connected with the first metal layer. Herein, the first common pad 504 may be a pad that is connected with the substrate of the active device formed in each of the active areas.

Then, reference is made to FIG. 5B, the operation at S402 is executed: a first conductive wire is formed at a preset distance from the plurality of active areas in the semiconductor substrate. The first conductive wire is connected with the substrate of a respective active device formed in each of the plurality of active areas.

Herein, Poly-Si is used as a material of the first conductive wire, an implementation of the operation that the first conductive wire is formed at the preset distance from the active areas in the semiconductor substrate may be as follows. The Poly-Si is deposited in the semiconductor substrate to form the first conductive wire at the preset distance from the active areas.

FIG. 5B is a schematic diagram of a layout including the first conductive wire provided in the embodiments of the disclosure. As illustrated in FIG. 5B, the first conductive wire 505 on the semiconductor substrate 500 is parallel to a wire connecting the positions where the plurality of active areas 501 are located, and the first conductive wire is located above each of the active areas 501. The first conductive wire 505 includes one first leading-out terminal 5051 and six second leading-out terminals 5052. The first leading-out terminal 5051 is connected with the first common pad 504, and each of the second leading-out terminals 5052 is connected with the substrate of the active device 506 formed in each of the active areas 501.

It is to be understood that the active device 506 will be generated in the active area 501 in the subsequent step. In some embodiments, the operation S402 may further include the following operation. The active device 506 is formed in each of the active areas 501.

Further, reference is made to FIG. 5C, the operation at S403 is executed: a plurality of first contact holes are formed on the first conductive wire.

In an implementation, the S403 may include the following operations.

S4031, a dielectric layer is formed on a surface of the first conductive wire.

It is to be understood that the dielectric layer may be an insulated dielectric layer, for example, the dielectric layer may be an insulated dielectric layer formed by SiO2.

S4032, the dielectric layer is etched to form a plurality of perpendicular through holes on the first conductive wire.

Herein, the perpendicular through holes refer to through holes perpendicular to a bottom surface of the semiconductor substrate or a surface of the dielectric layer.

S4033, the perpendicular through holes are filled with a conductive material to form a plurality of first contact holes.

FIG. 5C is a schematic diagram of a layout including the plurality of first contact holes on the first conductive wire provided in the embodiments of the disclosure. As illustrated in FIG. 5C, one first leading-out terminal 5051 and each of the six second leading-out terminals 5052 of the first conductive wire 505 are provided with at least one first contact hole 5071.

Reference is made to FIG. 5C, in the embodiments of the disclosure, the following operation is also executed while S403 is executed: at least one second contact hole 5072 is formed on the substrate of a respective active devices 506.

The operation of forming the second contact holes 5072 is similar to the operation of forming the first contact hole 5071.

Finally, reference is made to FIG. 5D, the operation at S404 is executed: a first metal layer is formed on top of each of the plurality of first contact holes to obtain the semiconductor testing structure. The first metal layer is electrically connected with a first common pad, and the first common pad is configured to perform an electric performance test on the semiconductor testing structure.

FIG. 5D is a schematic diagram of a layout including the first metal layer provided in the embodiments of the disclosure. As illustrated in FIG. 5D, the first metal layer 5021 is located on top of each of the first contact holes 5071 (which are not shown and have been covered with the first metal layer 5021) and on top of the each of the second contact holes 5072 (which are not shown and have been covered with the first metal layer 5021).

Figure 5E:
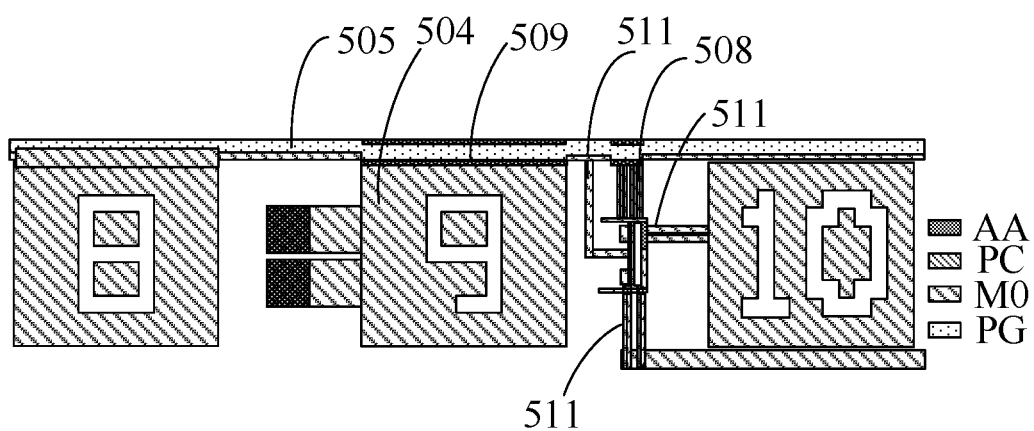
FIG. 5E is a fifth diagram illustrating a process of forming a semiconductor testing structure provided in an embodiment of the disclosure.
Figure 5F:
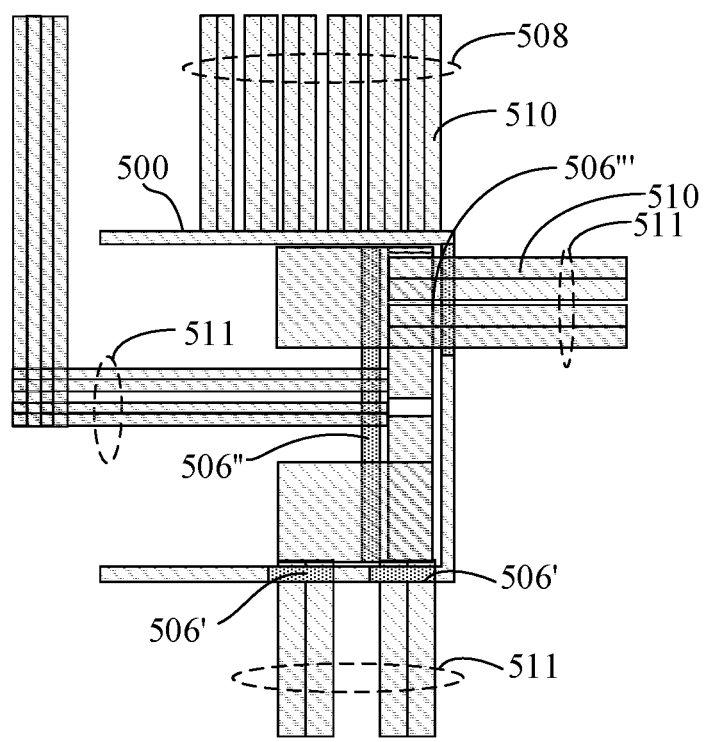
FIG. 5F is a sixth diagram illustrating a process of forming a semiconductor testing structure provided in an embodiment of the disclosure.

In order to facilitate understanding of the technical solution of the embodiments of the disclosure through FIG. 5D, reference may be made with FIG. 5E and FIG. 5F. In some embodiments, the operation S404 further includes the following operations. A connection pad 503 and the first common pad 504 are formed in a reserved position 502 between adjacent active areas 501, and the connection pads 503 and the first common pad 504 are connected with the first metal layer 5021.

Herein, an implementation of the operation that the connection pads 503 and the first common pad 504 are connected with the first metal layer 5021 may be as follows. A conductive material is deposited on each of the connection pads 503 and the first common pad 504, to connect each of the connection pads 503 and the first common pad 504 with the first metal layer 5021.

In some embodiments, the operation S404 includes the following operation.

The first metal layer 5021 is formed on top of each of the plurality of first contact holes 5071 and on top of each of the plurality of second contact holes 5072 to obtain the semiconductor testing structure.

Reference is made to FIG. 5E, the operation that the first metal layer 5021 is formed on top of each of the plurality of first contact holes 5071 and on top of each of the plurality of second contact holes 5072 to obtain the semiconductor testing structure includes the following operations.

S4041, after the first metal layer 5021 is formed on top of each of the plurality of first contact holes 5071 and on top of each of the plurality of second contact holes 5072, a respective second conductive wire 508 is formed between the at least one first contact hole 5071 on each of the plurality of second leading-out terminals 5052 and at least one second contact hole 5072 on a substrate of an active device 506 corresponding to the second leading-out terminal, to obtain the semiconductor testing structure.

In an example, an implementation of the operation that the second conductive wire 508 is formed between the at least one first contact hole 5071 on each of the plurality of second leading-out terminals 5052 and the at least one second contact hole 5072 on the substrate of the active device 506 corresponding to the second leading-out terminal, to obtain the semiconductor testing structure may be as follows. One metal wire 510 is formed between two or three first contact holes 5071 in each of the plurality of second leading-out terminals 5052 and two or three second contact holes 5072 in the substrate of the active device 506. Or, one metal wire 510 is formed between each first contact hole 5071 in each of the plurality of second leading-out terminals 5052 and each second contact hole 5072 in the substrate of the active device 506.

S4042, a third conductive wire 509 is formed between the at least one first contact hole 5071 on the first leading-out terminal 5051 and the first common pad 504 to obtain the semiconductor testing structure.

In some embodiments, an implementation of the operation that the third conductive wire 509 is formed between the at least one first contact hole 5071 on the first leading-out terminal 5051 and the first common pad 504 may be as follows. At least one metal wire 510 is formed between two or three first contact holes 5071 in each of the plurality of first leading-out terminal 5051 and the first common pad 504.

In some embodiments, the operation S404 further includes an operation that a respective fourth conductive wire 511 is formed between a respective third leading-out terminal 5061 of each of the plurality of active devices 506 and a connection pad 503 corresponding to the third leading-out terminal.

Herein, when the active device is an MOS transistor, the third leading-out terminals 5061 refer to a gate 506', a source 506" and a drain 506''' of the MOS transistor. Correspondingly, the connection pad 503 refers to a pad connected with the gate 506', source 506" and drain 506''' of the MOS transistor respectively. It is to be understood that the substrate terminal of the MOS transistor does not belong to the third leading-out terminals 5061, and the pad corresponding to the substrate terminal 500 of the MOS transistor does not belong to the connection pad 503 but to the first common pad 504.

It is to be understood that the connection pad 503 may include a second common pad 5031 (not shown) and a third common pad 5032 (not shown). A gate of each of the active devices 506 (MOS transistor) may be connected with the shared second common pad 5031. A source of each of the MOS transistors may be connected to the shared third common pad 5032. However, a drain of each of the MOS transistors does not share a common pad and the drain of each of the MOS transistors corresponds to a connection pad 503.

In some implementations, when the fourth conductive wire 511 is a conductive wire between the gate 506" of the active device 506 and the second common pad 5031, the fourth conductive wire 511 includes at least two metal wires 510. The second common pad 5031 is connected with the gates 506" of the plurality of active devices 506.

In some embodiments, at least one of the second conductive wire 508, the third conductive wire 509, or the fourth conductive wire 511 includes at least two metal wires 510.

In the embodiments of the disclosure, each of the third leading-out terminals 509 of each of the active devices 506 is connected with a connection pad 503 corresponding to the third leading-out terminal via at least two metal wires 510. In this way of connection, parasitic resistance introduced by the metal wires 510 can be reduced, such that the test error can be further reduced, and a more precise test result can be obtained.

FIG. 5F is a schematic diagram of a connection structure of a single active device provided in the embodiments of the disclosure. As illustrated in FIG. 5F, the second conductive wire 508 led out from the substrate terminal of the active device 506 includes at least two metal wires 510. The fourth conductive wire 511 led out from each of the third leading-out terminal 5061 of the active device 506 also includes at least two metal wires 510.

Figure 5G:
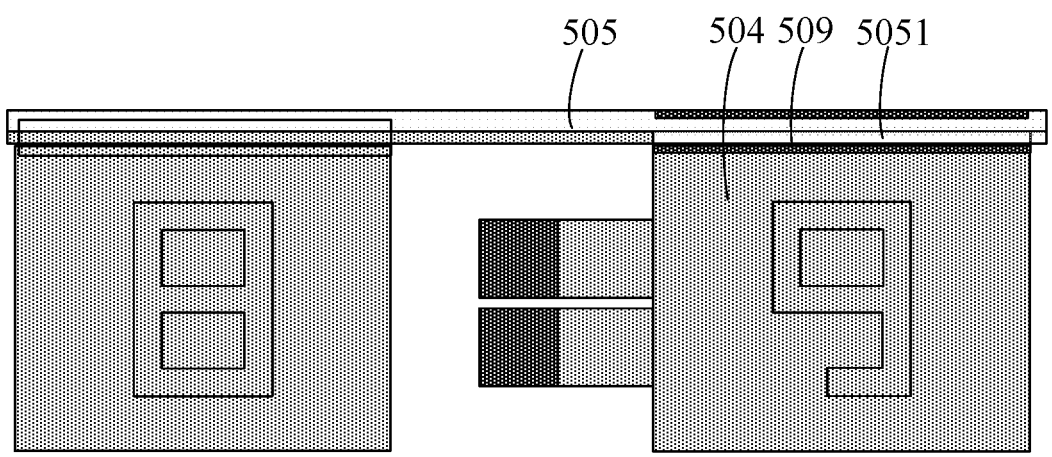
FIG. 5G is a schematic diagram of a connection structure between a first common pad and a first conductive wire provided in an embodiment of the disclosure.

FIG. 5G is a schematic diagram of a connection structure of a first common pad and a first conductive wire provide in the embodiments of the disclosure. As illustrated in FIG. 5G, the first leading-out terminal 5051 of the first conductive wire 505 is connected with the first common pad 504 via the third conductive wire 509 which includes at least two metal wires 510.

In addition, the embodiments of the disclosure further provide a semiconductor testing structure. The semiconductor testing structure is formed by the method for forming the semiconductor testing structure provided in the above embodiments. The semiconductor testing structure includes a semiconductor substrate 500, a first conductive wire 505, a plurality of first contact holes 5071 and a first metal layer 5021.

The semiconductor substrate 500 at least includes a plurality of active areas 501 arranged separately.

The first conductive wire 505 is connected with a substrate of a respective active device 506 formed in each of the plurality of active areas 501. The first conductive wire is formed in the semiconductor substrate 512 and is at a preset distance from the plurality of active areas 501.

The plurality of first contact holes 5071 is formed on the first conductive wire 505.

The first metal layer 5021 is formed on top of each of the plurality of first contact holes 5071. The first metal layer 5021 is electrically connected with a first common pad 504, and the first common pad 504 is configured to perform an electric performance test on the semiconductor testing structure.

In some embodiments, the plurality of first contact holes 5071 include a plurality of perpendicular through holes on the first conductive wire 505.

In some embodiments, the first conductive wire 505 includes: a first leading-out terminal 5051, a plurality of second leading-out terminal 5052 and a plurality of first contact holes 5071. The first leading-out terminal is connected with the first common pad 504. Each of the plurality of second leading-out terminals is connected with the substrate of the respective active device 506 formed in each of the plurality of active areas 501. The plurality of first contact holes include at least one first contact hole 5071 on the first leading-out terminal 5051 and at least one first contact hole 5071 on each of the plurality of second leading-out terminals 5052.

In some embodiments, the structure further includes at least one second contact hole 5072 formed on the substrate of the respective active device 506. The first metal layer 5021 is located on top of each of the plurality of first contact holes 5071 and on top of each of the plurality of second contact holes 5072.

In some embodiments, the first metal layer 5021 includes a second conductive wire 508 between the at least one first contact hole 5071 on each of the plurality of second leading-out terminals 5052 and at least one second contact hole 5072 on a substrate of an active device 506 corresponding to the second leading-out terminal.

In some embodiments, the first metal layer 5021 includes a third conductive wire 509 between the at least one first contact hole 5071 on the first leading-out terminal 5051 and the first common pad 504.

In some embodiments, the structure further includes a plurality of active devices 506 and a fourth conductive wire 511. Each of the plurality of active devices 506 is formed in a respective one of the plurality of active areas 501. The fourth conducting wire is located between each of the third leading-outer terminals 5061 of each of the a plurality of active devices 506 and a connection pad 503 corresponding to the third leading-out terminal 5061.

In some embodiments, at least one of the second conductive wire 508, the third conductive wire 509 and the fourth conductive wire 511 includes at least two metal wires 510.

In some embodiments, when the fourth conductive wire 511 is a conductive wire between a gate 506" and the second common pad 5031, the fourth conductive wire 511 includes a plurality of metal wires 510. The second common pad 5031 is connected with gates 506" of the plurality of active devices 506.

In some embodiments, the structure further includes a connection pad 503 and the first common pad 504 which are located in a reserved position between adjacent active areas 501 and are connected with the first metal layer 5021.

The semiconductor device provided in the embodiments of the disclosure is similar to a semiconductor device provided by the method for forming a semiconductor device in the above embodiments. Technical features which are not disclosed in detail in the embodiments of the disclosure could be understood with reference to the above embodiments, which will not be elaborated herein again.

The embodiments of the disclosure provide a semiconductor testing structure. Since the formed first conductive wire is connected with the substrate of the active device formed in each of the active areas, and the plurality of first contact holes on the first conductive wire are connected with the first meta layer, in addition, the first metal layer is electrically connected with the first common pad, thus the first conductive wire is also connected with the first common pad. In such way, the substrate of the active device formed in each of the active areas may be connected with the first common pad via the first conductive wire. Therefore, when the first metal layer is tested, even if the wafer is placed on the chuck of the measurement device, a voltage injected by a test probe into the first common pad will be introduced to the substrate of the active device formed in each of the active areas via the first conductive wire and will not leak, such that electrical drift and effect on electrical adjustment of the MOS transistor can be reduced.

In some embodiments provided by the disclosure, it is to be understood that the disclosed device and method may be implemented in a non-objected manner. The device embodiments described above are exemplary only, and for example, division of the units is only a logic function division, and other division manners may be adopted during practical implementation. For example, multiple units or components may be combined or may be integrated into another system, and some features may be neglected or not executed.

The features disclosed in method or device embodiments provided in the disclosure may be freely combined in case of no conflict, to obtain new method embodiments or device embodiments.

The above description is only detailed implementation of the disclosure and is not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the protection scope of the claims.

What is claimed is:

1. A method for forming a semiconductor testing structure, comprising:
   providing a semiconductor substrate, the semiconductor substrate comprising a plurality of active areas arranged separately;
   forming a first conductive wire at a preset distance from the plurality of active areas in the semiconductor substrate, the first conductive wire being connected with a substrate of a respective active device formed in each of the plurality of active areas;
   forming a plurality of first contact holes on the first conductive wire; and
   forming a first metal layer on top of each of the plurality of first contact holes to obtain the semiconductor testing structure, wherein the first metal layer is electrically connected with a first common pad, and the first common pad is configured to perform an electric performance test on the semiconductor testing structure.

2. The method of claim 1, wherein forming the plurality of first contact holes on the first conductive wire comprises:
   forming a dielectric layer on a surface of the first conductive wire;
   etching the dielectric layer to form a plurality of perpendicular through holes on the first conductive wire; and
   filling the plurality of perpendicular through holes with a conductive material to form the plurality of first contact holes.

3. The method of claim 1, wherein the first conductive wire comprises a first leading-out terminal and a plurality of second leading-out terminals, the first leading-out terminal is configured to be connected with the first common pad, and each of the plurality of second leading-out terminals is configured to be connected with the substrate of the respective active device formed in the each of the plurality of active areas; and
   forming the plurality of first contact holes on the first conductive wire comprises:
   forming at least one first contact hole on the first leading-out terminal and forming at least one first contact hole on each of the plurality of second leading-out terminals.

4. The method of claim 3, further comprising:
   forming at least one second contact hole on the substrate of the respective active device; and
   forming the first metal layer on top of each of the plurality of first contact holes to obtain the semiconductor testing structure comprises:
   forming the first metal layer on top of each of the plurality of first contact holes and on top of each of the at least one second contact hole, to obtain the semiconductor testing structure.

5. The method of claim 4, wherein forming the first metal layer on top of each of the plurality of first contact holes and on top of each of the at least one second contact hole, to obtain the semiconductor testing structure comprises:
   after forming the first metal layer on top of each of the plurality of first contact holes and on top of each of the at least one second contact hole, forming a respective second conductive wire between the at least one first contact hole on each of the plurality of second leading-out terminals and at least one second contact hole on a substrate of an active device corresponding to the second leading-out terminal, to obtain the semiconductor testing structure.

6. The method of claim 5, wherein forming the first metal layer on top of each of the plurality of first contact holes and on top of each of the at least one second contact hole, to obtain the semiconductor testing structure further comprises:
   forming a third conductive wire between the at least one first contact hole on the first leading-out terminal and the first common pad.

7. The method of claim 1, further comprising:
   forming the respective active device in each of the plurality of active areas; and
   forming a respective fourth conductive wire between a respective third leading-out terminal of each of the plurality of active devices and a connection pad corresponding to the third leading-out terminal.

8. The method of claim 7, wherein at least one of the second conductive wire, the third conductive wire or the fourth conductive wire comprises at least two metal wires.

9. The method of claim 8, wherein the connection pad comprises a second common pad, and when the fourth conductive wire is a conductive wire between a gate of an active device and the second common pad, the fourth conductive wire comprises at least two metal wires; and wherein the second common pad is configured to be connected with gates of the plurality of active devices.

10. The method of claim 7, further comprising:
forming the connection pad and the first common pad in a reserved position between adjacent active areas, wherein the connection pad and the first common pad are both connected with the first metal layer.

11. The method of claim 1, wherein forming the first conductive wire at the preset distance from the plurality of active areas in the semiconductor substrate comprises:
depositing poly-silicon in the semiconductor substrate to form the first conductive wire at the preset distance from the plurality of active areas.

12. A semiconductor testing structure, comprising:
a semiconductor substrate comprising a plurality of active areas arranged separately;
a first conductive wire connected with a substrate of a respective active device formed in each of the plurality of active areas, wherein the first conductive wire is formed in the semiconductor substrate and is at a preset distance from the plurality of active areas;
a plurality of first contact holes formed on the first conductive wire; and
a first metal layer located on top of each of the plurality of first contact holes, wherein the first metal layer is electrically connected with a first common pad, and the first common pad is configured to perform an electric performance test on the semiconductor testing structure.

13. The semiconductor testing structure of claim 12, wherein the plurality of first contact holes comprise a plurality of perpendicular through holes formed on the first conductive wire.

14. The semiconductor testing structure of claim 12, wherein the first conductive wire comprises:
a first leading-out terminal connected with the first common pad; and
a plurality of second leading-out terminals each connected with the substrate of the respective active device formed in each of the plurality of active areas,
wherein the plurality of first contact holes comprise at least one first contact hole on the first leading-out terminal and at least one first contact hole on each of the plurality of second leading-out terminals.

15. The semiconductor testing structure of claim 14, further comprising:
at least one second contact hole formed on the substrate of the respective active device, wherein
the first metal layer is located on top of each of the plurality of first contact holes and on top of each of the at least one second contact hole.

16. The semiconductor testing structure of claim 15, wherein the first metal layer comprises:
a respective second conductive wire located between the at least one first contact hole on each of the plurality of second leading-out terminals and at least one second contact hole on a substrate of an active device corresponding to the second leading-out terminal.

17. The semiconductor testing structure of claim 16, wherein the first metal layer comprises:
a third conductive wire formed between the at least one first contact hole on the first leading-out terminal and the first common pad.

18. The semiconductor testing structure of claim 12, further comprising:
a plurality of active devices, each of the plurality of active devices being formed in a respective one of the plurality of active areas; and
a respective fourth conductive wire formed between a respective third leading-out terminal of each of the plurality of active devices and a connection pad corresponding to the third leading-out terminal.

19. The semiconductor testing structure of claim 18, wherein at least one of the second conductive wire, the third conductive wire or the fourth conductive wire comprises at least two metal wires.

20. The semiconductor testing structure of claim 18, wherein the connection pad and the first common pad are located in a reserved position between adjacent active areas and are connected with the first metal layer.

* * * * *